United States Patent [19]

Borel

[11] Patent Number: 5,457,338
[45] Date of Patent: Oct. 10, 1995

[54] PROCESS FOR MANUFACTURING ISOLATED SEMI CONDUCTOR COMPONENTS IN A SEMI CONDUCTOR WAFER

[75] Inventor: Joseph Borel, St. Egreve, France

[73] Assignee: Societe pour l'Etude et la Fabrication de Circuits Integres Speciaux E.F.C.I.S., Grenoble, France

[21] Appl. No.: 235,430

[22] Filed: Apr. 29, 1994

Related U.S. Application Data

[62] Division of Ser. No. 933,014, Aug. 20, 1992, Pat. No. 5,387,537.

[30] Foreign Application Priority Data

Jun. 21, 1983 [FR] France .................. 83 10243

[51] Int. Cl.$^6$ ...................... H01L 27/04
[52] U.S. Cl. .............. 257/510; 257/511; 257/513; 257/514; 257/515; 257/559; 257/622
[58] Field of Search .................. 257/510, 511, 257/513, 514, 515, 559, 622

[56] References Cited

U.S. PATENT DOCUMENTS

| | | |
|---|---|---|
| 4,111,724 | 10/1978 | Ogiue et al. |
| 4,445,268 | 5/1984 | Hirao |
| 4,494,303 | 1/1985 | Celler et al. |
| 4,498,951 | 2/1985 | Tamura et al. |
| 4,523,962 | 6/1985 | Nishimura |
| 4,565,584 | 1/1986 | Tamura et al. |
| 4,609,407 | 9/1986 | Masao et al. |

FOREIGN PATENT DOCUMENTS

| | | |
|---|---|---|
| 0045848 | 2/1982 | European Pat. Off. |
| 0060761 | 8/1982 | European Pat. Off. |
| 235008A3 | 9/1982 | Germany |
| 40-23210 | 10/1965 | Japan |
| 49-4454 | 11/1974 | Japan |
| 56-58269 | 5/1981 | Japan |
| 56-73697 | 6/1981 | Japan |
| 57-1225 | 1/1982 | Japan |
| 58-31552 | 2/1983 | Japan |
| 2171557 | 2/1986 | United Kingdom |

OTHER PUBLICATIONS

Borland, John O., "Advanced Dielectric Isolation Through Selective Epitaxial Growth Techniques", Solid State Technology, Aug. 1985, pp. 141–148.

Yu, H. N., "Fabrication of Planar Arrays of Semiconductor Chips by Epitaxial Growth", vol. 7, No. 11, Apr. 1965, p. 1104.

Claasen, W. A. P., "the Nucleation of CVD Silicon on SiO, and SiN Substrates", Auger Depth Profile Studies, vol. 128, No. 6, pp. 1353–1359.

Tanno, Kohetsu, "Selective Silicon Epitaxy Using Reduced Pressure Technique" Japanese Journal of Applied Physics, vol. 21, No. 9, Sept. 1982, pp. L564–L566.

Primary Examiner—Edward Wojciechowicz
Attorney, Agent, or Firm—Felsman, Bradley, Gunter & Dillon

[57] ABSTRACT

A process for manufacturing isolated semi conductor components in a semi conductor wafer of the type used in bipolar technology. In this process, polycrystalline silicon is deposited in a recess in a silicon substrate whose walls are insulated by a silicon nitride layer except for an opening formed in this nitride layer at the bottom of said recess. Then, the polycrystalline silicon is re-epitaxied so as to become monocrystalline silicon by thermal heating from the "nucleus" formed by the underlying silicon in said opening.

10 Claims, 3 Drawing Sheets

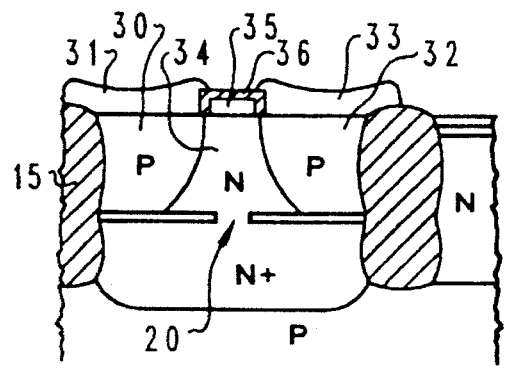
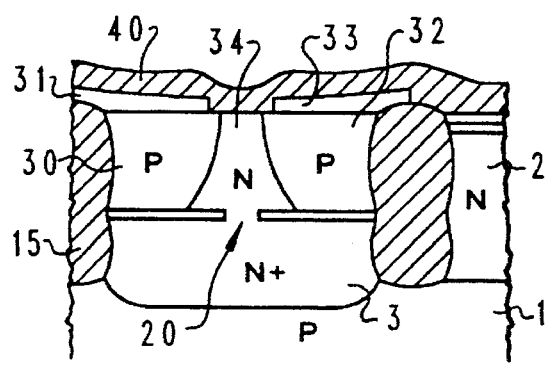
Fig. 4A    Fig. 5A
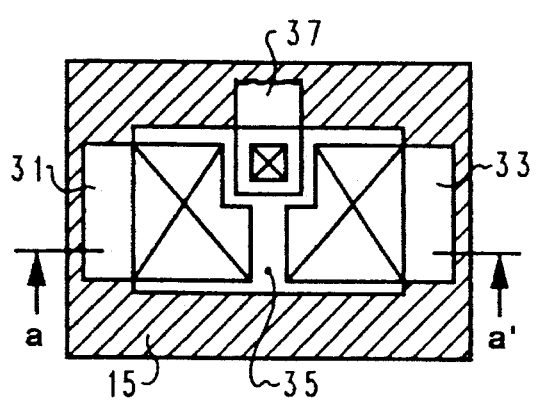
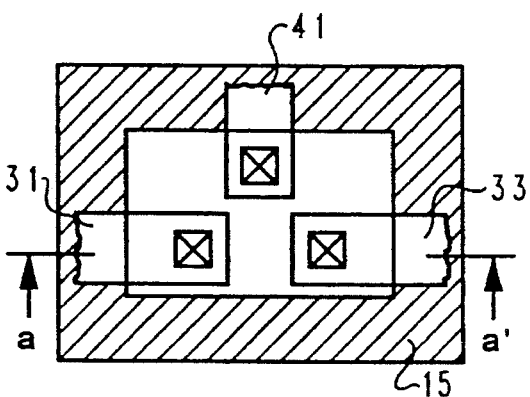
Fig. 4B    Fig. 5B
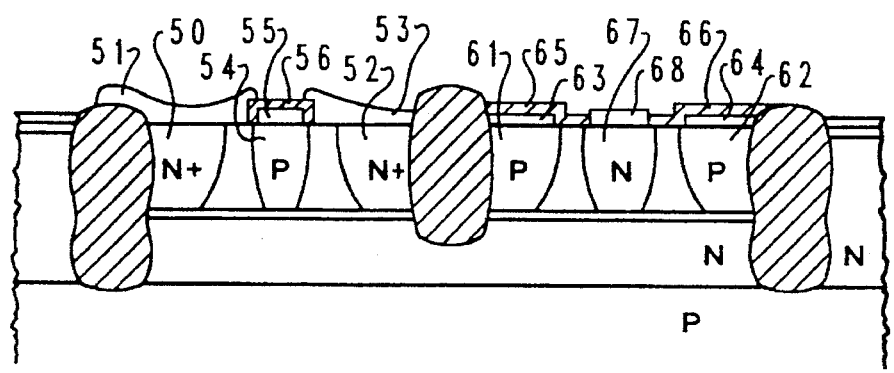
Fig. 6

PROCESS FOR MANUFACTURING ISOLATED SEMI CONDUCTOR COMPONENTS IN A SEMI CONDUCTOR WAFER

This is a division of application Ser. No. 07/933,014, filed Aug. 20, 1992, now U.S. Pat. No. 5,387,537, issued on Feb. 7, 1995.

BACKGROUND OF THE INVENTION

1. Field of the Invention

The present invention relates to a process for manufacturing isolated semi conductor components in a semi conductor wafer and, more particularly to a process compatible with semi conductor substrates of the type used in bipolar technology; that is to say a technology in which an epitaxied layer of a second type of conductivity is formed on a substrate of the first type of conductivity, buried layers of the second type of conductivity being possibly provided at localized chosen positions at the interface between the substrate and the epitaxied layer.

2. Description of the Prior Art

Usually, in bipolar technology, the different individual components of an integrated circuit are placed in zones surrounded by insulating walls, but the bottom of these zones corresponds to the substrate or to a buried layer and does not actually rest on an insulating layer, the insulation being obtained by a PN junction provided that the substrate is suitably biased. This lack of real insulation of the bottom of the caissons may, in some cases, adversely affect the correct operation of the integrated circuit and in any case complicate the task of the designer who must always plan for the substrate to be at an extreme biasing level. In addition, different parasitic effects occur because the substrate may form one of the layers of a parasitic transistor or thyristor.

It is desirable in practice to be able to make use of a bipolar integrated circuit having at least a number of MOS or bipolar transistors completely insulated from the substrate or in which at least the drain, source, collector or emitter layers are insulated from this substrate. The object of the present invention is to provide such components and a process for manufacturing these components compatible with bipolar integrated circuit technology,

SUMMARY OF THE INVENTION

To attain this object, the present invention provides a process for manufacturing isolated semi conductor components on a semi conductor wafer of the type used in bipolar technology, comprising a substrate of a first type of conductivity on which is formed an epitaxial layer of the second type of conductivity, buried layers of the second type of conductivity being possibly provided at chosen positions at the interface between the substrate and the epitaxied layer. This process comprises essentially the following steps: hollowing out partially the epitaxied layer in zones of chosen perimeter defined by means of a first insulating masking layer; depositing a second insulating masking layer; opening a window locally in this second insulating layer at the bottom of the hollowed out zone; depositing polycrystalline silicone in the hollowed out zones; re-epitaxying this polycrystalline silicone from its zone in contact with the underlying silicon at the position of the window and forming the desired components in the re-epitaxied monocrystalline zones.

According to one aspect of the present invention, an insulating wall passing through the re-epitaxied layer may then be formed, the bottom of this wall corresponding to the window formed in the second insulating, layer.

BRIEF DESCRIPTION OF THE DRAWINGS

These principle features of the present invention and others will be set forth in greater detail in particular embodiments with reference to the accompanying Figures in which:

FIGS. 4 to 6 show examples of components formed by using the process of the present invention.

Figure 1A:
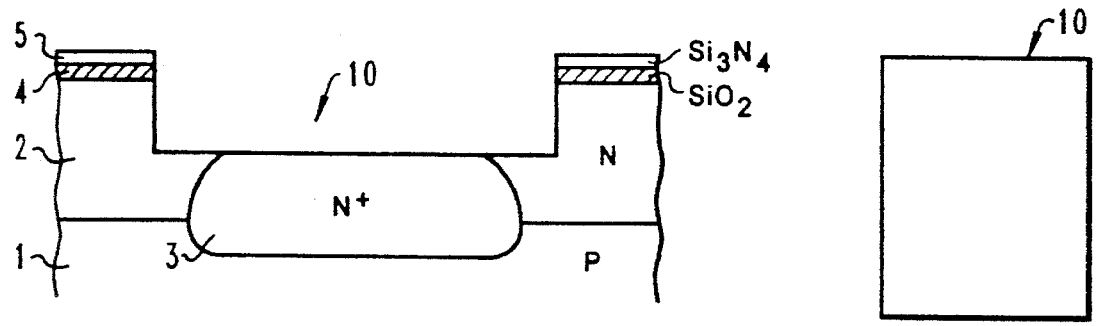
FIGS. 1a to 1c represent a succession of steps in the process of the present invention.

In these different Figures, as well as from one Figure to another, no scale has been respected, on the contrary the relative lateral and transverse dimensions of the different layers have been arbitrarily expanded or contracted for simplifying understanding of the Figures or, quite simply, for making them compatible with the format of the drawing plates.

DESCRIPTION OF THE PREFERRED EMBODIMENTS

Figure 1B:
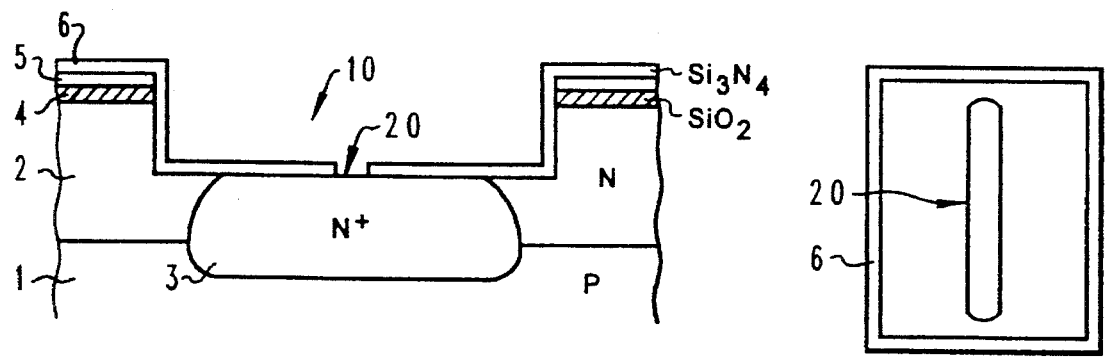
Figure 1C:
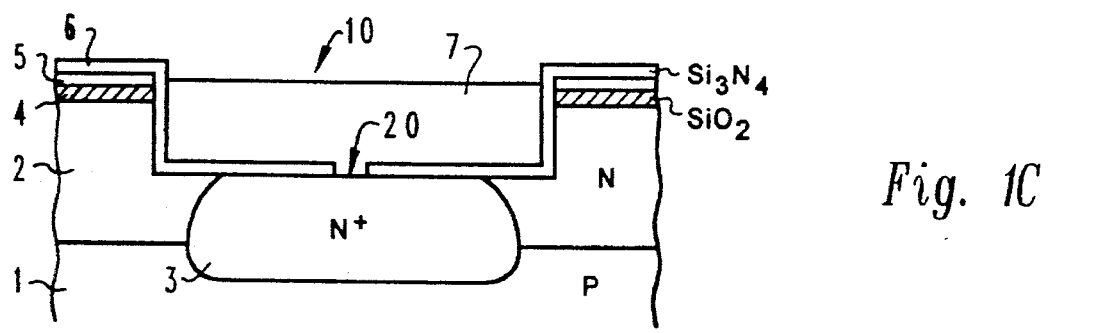

FIGS. 1a to 1c are schematical sectional views illustrating steps in the process of the invention, FIGS. 1a and 1b being accompanied by extremely schematical top views solely for facilitating understanding by the reader and the forms shown should in no wise be considered in a limiting way for all that.

In FIG. 1a, a portion of a bipolar integrated circuit wafer may be seen comprising on a P type silicon substrate 1 an N type epitaxied layer 2. There has also been shown a localized buried zone 3 at the substrate/epitaxied layer interface. It will be seen that provision of this localized buried layer is optional. On the other hand, this buried layer has been shown with a certain transverse dimension. In fact, it only acquires this dimension during successive thermal steps in the manufacturing process. On epitaxied layer 2 can be seen successively a silica layer 4, itself covered by a nitride layer 5. These layers 4 and 5 form a composite mask for forming a recessed zone 10, having for example a rectangular contour as is shown in the schematical top view. This recess 10 has a depth of the order of half the thickness of the epitaxied layer. For example, a depth of 0.5 micron if the epitaxied layer has a thickness of the order of 0.8 to 1 micron.

As shown in FIG. 1b, a silicon nitride layer 6 is then uniformly deposited on the wafer (possibly after a short oxidation) and this layer is opened at the bottom of the recess, by any known means, so as to form a window 20 causing the underlying monocrystalline silicon to appear. Window 20 has for example the shape of a slit situated substantially in the middle of the bottom of the recess. In the next step, which is illustrated in FIG. 1c, recess 10 is filled by any known means with polycrystalline silicon 7. Among these known means may be mentioned the one which consists in depositing polycrystalline silicon uniformly over the whole of the wafer to a thickness sufficient for providing a substantially flat surface, then in etching the polycrystalline silicon layer chemically until the silicon nitride layer 6 is reached. Other more elaborate processes may be used for obtaining such a flat surface. Mechanical lapping techniques may be used followed by chemical cleaning.

Then, the deposited polycrystalline silicon is recrystallized in the form of a monocrystal. This is carried out from the window 20 in contact with the underlying monocrystalline silicon by heating. This heating may be provided by moving a heating element at the surface of the wafer or by heat irradiation resulting from exposition to an intense light source which may be a laser or not. We find therefore in recess 10 a monocrystalline silicon zone, possibly doped depending on whether the polycrystalline silicon was deposited in the pure state or in the presence of a dopant. This monocrystalline silicon zone is insulated by the nitride layer G from the rest of the silicon wafer except at the position of window 20. In this polycrystalline silicon zone, elementary components may be formed in different ways, as will be described hereafter.

Figure 2:
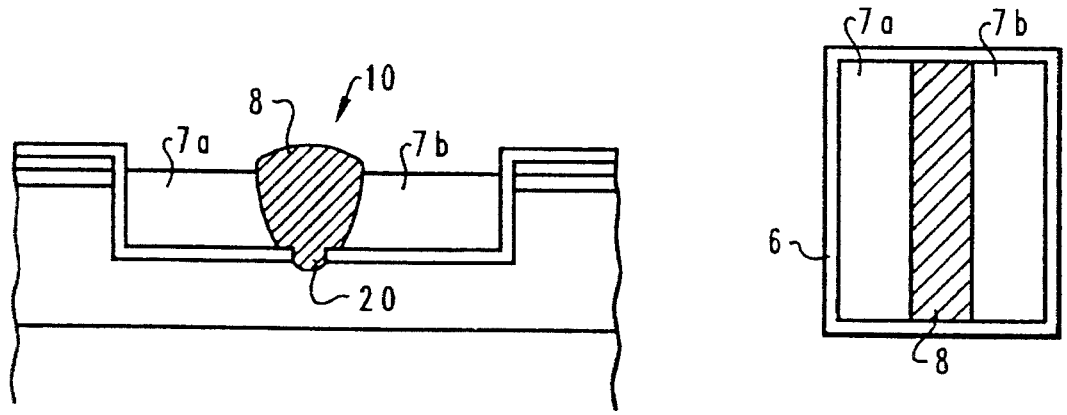
FIG. 2 illustrates an aspect of the present invention.

As shown in FIG. 2, if it is desired to obtain monocrystalline silicon zones completely insulated from the mass of the surrounding silicon, it is possible to "plug" window 20 communicating the polycrystalline silicon zone with the whole of the silicon wafer. For that, localized oxidation of the monocrystalline silicon 7 opposite window 20 may be provided, as shown in FIG. 2. This oxide zone, designated by reference 8, may for example be formed by again depositing a nitride layer on the monocrystalline silicon wafer etched at the positions opposite opening 20; after which, thermal oxidation is carried out in a conventional way. In another embodiment, it is possible to take advantage of the presence of the insulating layer 6 everywhere except at the positions of window 20. Then a second insulating layer will be deposited on the surface of zone 7 open substantially opposite window 20 and electrolytic anodisation will be carried out for transforming the monocrystalline silicon portion disposed between the two facing windows made from porous silicon which is then easily oxidized. Any other process forming a localized insulating layer may be used, for example the hollowing out of a furrow filled with insulator. Two separate entirely isolated zones 7a and 7b are obtained, as shown in FIG. 2, in the case where window 20 was, as was mentioned above, a substantially median slit formed in the nitride layer disposed at the bottom of opening 10. It would also have been possible to provide opening 20 at another position, for example along an edge at the bottom of opening 20. The oxidized zone would then be disposed laterally and a single isolated zone would be obtained. It will be noted, in the case of FIG. 2, that no localized $N^+$ type buried layer is shown. In fact, in this case, this buried layer does not offer particular advantages.

Figure 3A:
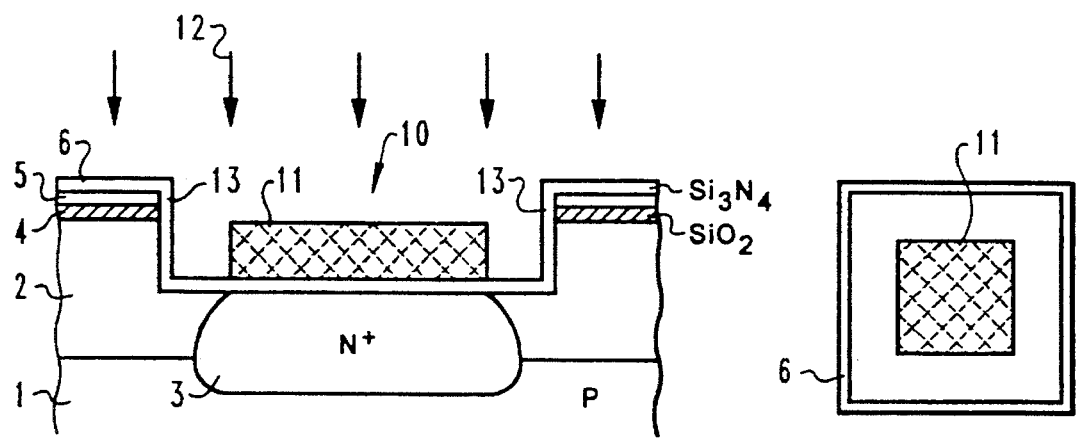
FIGS. 3a to 3c show successive steps of a variant of the process of the present invention.
Figure 3B:
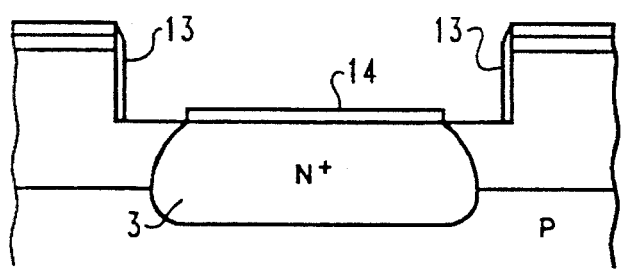
Figure 3C:
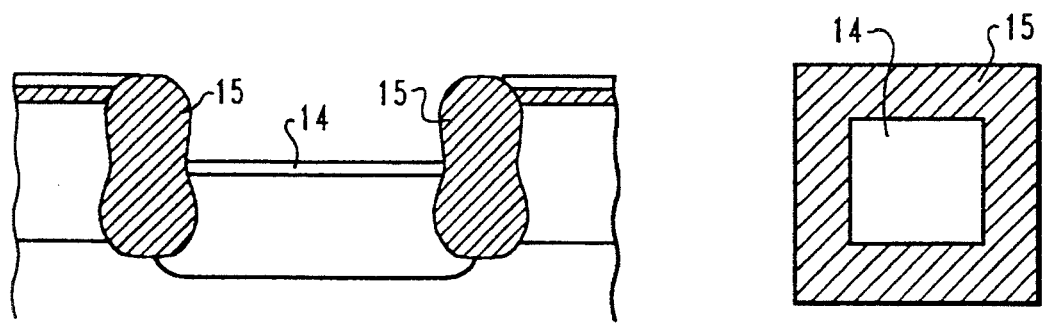

FIGS. 3a to 3c show sectional views of variants of the first steps of the process of the invention. In these Figures, layers or zones similar to those illustrated in FIGS. 1a and 1b are designated by the same references. With FIGS. 3a and 3c are associated very schematical top views.

As shown in FIG. 3a, a structure is first of all provided corresponding substantially to the one illustrated in FIG. 1b before formation of window 20. We have again a P type substrate 1, an N type epitaxied layer 2, an N+ type buried layer 3, a first mask formed from an oxide layer 4 and a nitride layer 5 used for defining an opening 10 and a second nitride layer 6 deposited after formation of opening 10. After these steps, a localized resin layer 11 is deposited at the bottom of recess 10 except at the periphery of this recess. Then directive ionic irradiation shown symbolically by arrows 12 is carried out. Consequently, the horizontal surfaces of the nitride layer 6 are strongly irradiated, except at the location protected by the resin layer 11 which is not irradiated at all, whereas the vertical portion 13 of the nitride layer disposed on the sides of the recess 10 are only weakly irradiated. This irradiation is adapted to confer different etching speeds in the irradiated and non irradiated zones. Thus, as shown in FIG. 3b when etching of the nitride layer is carried out, this latter is completely removed from the bottom of recess 10 and at the periphery of this bottom whereas the nitride layer remains in position in all the main central part 14 of the recess and the nitride layer 13, on the vertical walls of the recess, is made thinner.

Consequently, when thermal oxidation is then carried out, this oxidation develops from the visible silicon zones at the periphery and at the bottom of the recess and is continued until the thinned nitride parts 13 are completely oxidized. Then, there remains in position at least a part of the thickness of the nitride layer 14 at the bottom of the recess. Thus a structure is obtained substantially such as shown in FIGS. 3c in which the oxide zone developed at the periphery of the recess is designated by reference 15. The duration of the oxidation and the thickness of the thinned nitride zone 13 are chosen on the one hand as has been mentioned so that the nitride layer 13 is completely oxidized at the end of the process, but also so that the oxidized zone reaches the interface between substrate 1 and epitaxied layer 2 (if the depth of the recess 10 is substantially equal to half the thickness of the epitaxied layer, the oxide zone 13 will be substantially flush with the level of the visible surface of this epitaxied layer).

After the step shown in FIG. 3c, there is formed in the nitride layer 14 a window 20 of the type illustrated in FIG. 1b and the subsequent steps already described above with reference to FIG. 1c are carried out.

An important advantage of this embodiment is that, in the case where opening 20 is not "plugged again", the reepitaxied silicon zone is in contact through this opening with the whole of the underlying epitaxied layer; the oxide barrier 15 illustrated in FIG. 3c then allows lateral insulation. Furthermore, even in the case where window 20 is "replugged" in the way described above with reference to FIG. 2, the thin nitride layer 6 may have defects and then the monocrystalline silicon zone 7a, 7b risks being in contact with the epitaxied layer. If the insulating barrier 15 is provided, a defect will have a more negligible importance.

Another advantage of the process illustrated with reference to FIGS. 3a to FIG. 3c is that it is perfectly compatible with isolating techniques which may be generally used at present in constructing bipolar integrated circuits in the cases where it is desired to obtain a good inherent flatness of the surface of the device and to further avoid the phenomena related to the .appearance of beaks associated with deep localized oxidations. In fact, if the steps illustrated in FIGS. 3a to 3c are followed but without providing the resin layer 11, an insulating wall is obtained which practically does not project with respect to the surface of the silicon and in which no beak appears.

From the above described structures, elementary components, totally or partially insulated from the surrounding silicon, may be formed in the different isolated zones.

FIGS. 3a and 5a show sectional views of examples of PNP transistors formed by using the structure of the invention in which the bottom comprises an opening communicating with the underlying silicon. These structures will not be described in detail for they follow from manufacturing techniques, which today are conventional, similar or identical to those described previously in French patent application 81/05130 of the 13 Mar. 1981 in the name of the assignee and the second inventor of which is the inventor of the present application.

FIGS. 4b and 5b show very schematically top views corresponding respectively to FIGS. 4a and 5a, these sections being made through planes aa' indicated in the top views. As these Figures show, lateral PNP transistors are thus formed in which only the lateral faces of the P emitter and collector zones are in contact with the base zone, the bottom of the P emitter and collector zones being in contact with an insulated zone. This overcomes one of the essential difficulties which arise with conventional lateral PNP transistors in which injection takes place from the bottom of the emitter zone. Communication through window 20 between the N base zone and the buried layer improves the conductivity from one end of the base to the other, which is particularly advantageous in the case of the structure of FIGS. 5a and 5b where contact is taken only from one end of the base zone without the whole of top of this base zone being overdoped.

In FIGS. 4a and 4b, reference 30 designates a P-typelayer (for example emitter) over which is provided a polycrystalline silicon layer 31. Reference 32 designates the P type collector layer over which is provided a polycrystalline silicon zone 33. The N type base 34 has also thereover a polycrystalline silicon zone 35 surrounded by an insulating layer, for example silica 36. In FIG. 4b, a metalization 37 can also be seen for making contact with the position marked with a cross on the polycrystalline silicon base layer 45. In FIG. 5a and 5b, we find again the emitter and collector layers 30 and 32 covered with polycrystalline silicon layers 31 and 33 but this time no polycrystalline silicon layers are provided in contact with the base over the whole of its length, reference 40 designating an oxide layer. In this case, as shown in FIG. 5b, a metalization 41 establishes contact directly with the base layer 4, while possibly providing a heavily doped contact well going down as far as the buried N+ type layer 3. Of course, these Figures and the description thereof are very schematical and more detailed embodiments may be found in the above mentioned patent application.

FIG. 6 illustrates one application of the present invention in the case where a structure such as the one shown in FIG. 2 is provided comprising two completely isolated zones in which is it possible to form, for example by the techniques described in the above mentioned patent application, NPN and PNP transistors or other elementary components. Very schematically, the NPN transistor comprises an emitter layer 50 covered with a polycrystalline layer 51, a collector layer 52 covered by a polycrystalline silicon layer 5 and a P type base layer 54 covered by a polycrystalline silicon layer 55 insulated by an oxide layer 56. In the case of PNP transistors, the collector and emitter layers 61 and 62 are covered by polycrystalline silicon layers 63 and 64 insulated by oxide layers 65 and 66. The N type base zone 67 is covered by a polycrystalline layer 68. Depending on the performances desired for the NPN and PNP transistors, the two reepitaxied zone halves may have the initial type of doping or corrective doping may be provided for one of these. two zones.

The present invention is not limited to the embodiments which have been explicitly described, in particular numerous variants may be derived therefrom by a man skilled in the art taking into account the knowledge acquired at the time of the present application. Also, other applications of the isolated semi-conductor zones formed in accordance with the invention may be provided. Thus, only applications to bipolar transistors have been described, but applications may be contemplated to NOS type transistors, for example DNOS type transistors compatible with bipolar technologies. Similarly, the different embodiments described above may be combined together. It will for example be noted that FIG. 6 combines FIG. 2 with a variant of FIGS. 3a to 3c (lateral insulation by a thermal silica wall).

What is claimed is:

1. A structure for an integrated circuit, comprising:
   a semiconductor substrate;
   a recess within the semiconductor substrate, the recess having sides and a bottom;
   an insulating layer covering the sides of the recess, and all except a selected portion of the recess bottom, wherein an opening to the substrate is formed in the selected portion;
   a region of epitaxial silicon filling the recess and having an upper surface approximately coplanar with an upper surface of the substrate; and
   an oxide plug extending from the epitaxial silicon upper surface to the bottom of the recess, and filling the opening, wherein the epitaxial region is insulated from the substrate.

2. The structure of claim 1, further comprising a transistor formed in the epitaxial region.

3. The structure of claim 2, wherein the transistor comprises a bipolar transistor.

4. The structure of claim 1, further comprising at least two transistors formed in the epitaxial region.

5. The structure of claim 1, wherein the insulating layer comprises silicon nitride.

6. A structure for an integrated circuit, comprising:
   a semiconductor substrate having an upper surface;
   a recess within the substrate and extending below the surface thereof, wherein the recess has a bottom parallel to the substrate upper surface;
   an insulating layer lying on the recess bottom;
   an oxide sidewall region forming sides of the recess and extending around the periphery thereof, wherein the oxide sidewall region extends approximately vertically from the substrate upper surface into the substrate to a depth below the bottom of the recess;
   a region of epitaxial silicon filling the recess, and having an upper surface approximately coplanar with the substrate upper surface; and
   at least one active semiconductor device formed within the epitaxial region.

7. The structure of claim 6, further comprising:
   an opening through the insulating layer, wherein the epitaxial region makes contact with a portion of the substrate underlying the recess.

8. The structure of claim 6, further comprising:
   a region of thermal oxide, extending from the epitaxial silicon region upper surface through the epitaxial silicon region to contact the insulating layer.

9. The structure of claim 8, further comprising:
   an opening through the insulating layer, wherein the region of thermal oxide fills the opening so that the epitaxial silicon layer is electrically isolated from the substrate.

10. The structure of claim 6, wherein the insulating layer comprises silicon nitride.

* * * * *